United States Patent
Tseng et al.

(10) Patent No.: US 10,068,909 B1
(45) Date of Patent: Sep. 4, 2018

(54) LAYOUT PATTERN OF A MEMORY DEVICE FORMED BY STATIC RANDOM ACCESS MEMORY

(71) Applicant: UNITED MICROELECTRONICS CORP., Hsin-Chu (TW)

(72) Inventors: Chun-Yen Tseng, Tainan (TW);
Ching-Cheng Lung, Tainan (TW);
Yu-Tse Kuo, Tainan (TW);
Chun-Hsien Huang, Tainan (TW);
Chien-Hung Chen, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/795,270

(22) Filed: Oct. 27, 2017

(30) Foreign Application Priority Data

Sep. 22, 2017 (CN) .......................... 2017 1 0864858

(51) Int. Cl.
*G11C 11/412* (2006.01)
*G11C 11/40* (2006.01)
(Continued)

(52) U.S. Cl.
CPC ........ *H01L 27/1104* (2013.01); *G11C 11/412* (2013.01); *G11C 11/419* (2013.01);
(Continued)

(58) Field of Classification Search
CPC . G06C 11/412; G06C 11/419; H01L 27/1104; H01L 27/0207; H01L 27/088; H01L 29/0847; H01L 29/42376; H01L 23/528; G06F 17/50
(Continued)

(56) References Cited

U.S. PATENT DOCUMENTS

| 5,631,863 | A | * | 5/1997 | Fechner | .............. | G11C 11/4125 |
| | | | | | | 257/903 |
| 2007/0274140 | A1 | * | 11/2007 | Joshi | ........................ | G11C 7/02 |
| | | | | | | 365/189.11 |

(Continued)

OTHER PUBLICATIONS

Sarfraz, Title of Periodical:Characterization of a Low Leakage Current and High-Speed 7T SRAM Circuit with Wide Voltage Margins, 2013.

(Continued)

*Primary Examiner* — Dao H Nguyen
(74) *Attorney, Agent, or Firm* — Winston Hsu

(57) ABSTRACT

The present invention provides a layout pattern of a memory device composed of static random access memory (SRAM), comprising four memory units located on a substrate, each memory unit being located in a non-rectangular region, the four non-rectangular regions combine a rectangular region, wherein each memory unit comprises a first inverter comprising a first pull-up transistor (PL1) and a first pull-down transistor (PD1), a second inverter comprises a second pull-up transistor (PL2) and a second pull-down transistor (PD2), an access transistor (PG) and a switching transistor (SW), wherein the source of the PG is coupled to an input terminal of the first inverter and a drain of the SW, a source of the SW is coupled to an output of the second inverter, wherein the PD1, the PD2, the SW, and the PG comprise a first diffusion region, the PL1 and the PL2 comprise a second diffusion region.

20 Claims, 6 Drawing Sheets

(51) Int. Cl.
*H01L 27/11* (2006.01)
*H01L 27/02* (2006.01)
*H01L 23/528* (2006.01)
*G11C 11/419* (2006.01)
*H01L 29/423* (2006.01)
*H01L 29/08* (2006.01)
*H01L 27/088* (2006.01)

(52) U.S. Cl.
CPC ........ *H01L 23/528* (2013.01); *H01L 27/0207* (2013.01); *H01L 29/42376* (2013.01); *H01L 27/088* (2013.01); *H01L 29/0847* (2013.01)

(58) Field of Classification Search
USPC ................ 257/369, 903, 904; 365/154, 156; 716/118
See application file for complete search history.

(56) References Cited

U.S. PATENT DOCUMENTS

| | | | |
|---|---|---|---|
| 2009/0323401 A1* | 12/2009 | Huang | G11C 8/16 365/156 |
| 2011/0073958 A1* | 3/2011 | Chang | H01L 27/0207 257/390 |
| 2013/0223136 A1* | 8/2013 | Chuang | G11C 29/50 365/154 |
| 2016/0093365 A1 | 3/2016 | Song | |

OTHER PUBLICATIONS

Tseng, Title of Invention: Six-Transistor Static Random Access Memory Cell and Operation Method Thereof, U.S. Appl. No. 15/413,436, filed Jan. 24, 2017.

\* cited by examiner

LAYOUT PATTERN OF A MEMORY DEVICE FORMED BY STATIC RANDOM ACCESS MEMORY

BACKGROUND OF THE INVENTION

1. Field of the Invention

The present invention relates to a static random access memory (SRAM), and more particularly to a layout pattern consisting of static random access memory (SRAM) cells with increased stability and increased writing speed.

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer systems as a cache memory.

Referring to FIG. 1, FIG. 1 illustrates a circuit diagram of a conventional six-transistor SRAM (6T-SRAM) cell. The device includes at least one SRAM cell, each SRAM cell including a six-transistor SRAM (6T-SRAM) cell 10.

Each 6T-SRAM cell 10 is composed of a first pull-up transistor 12, a second pull-up transistor 14, and a first pull-down transistor 16, a second pull-down transistor 18, a first access transistor 20 and a second access transistor 21. These six devices (transistors) constitute a set of flip-flops. The first and the second pull-up transistors 12 and 14, and the first and the second pull-down transistors 16 and 18 constitute a latch circuit 22 that stores data in the storage nodes 24 and 26. Since the first and the second pull-up transistors 12 and 14 act as power load devices, they can be replaced by resistors. Under this circumstance, the static random access memory becomes a four-transistor SRAM (4T-SRAM). In addition, the first and the second pull-up transistors 12 and 14 preferably share a source/drain region and electrically connect to a voltage source (voltage node) Vcc, and the first and the second pull-down transistors 16 and 18 share a source/drain region and electrically connect to a voltage source (voltage node) Vss.

Preferably, the first and the second pull-up transistors 12 and 14 of the 6T-SRAM cell 10 are composed of p-type metal oxide semiconductor (PMOS) transistors, and the first and the second pull-down transistors 16 and 18, the first access transistors 20 and the second access transistors 21 are composed of n-type metal oxide semiconductor (NMOS) transistors. The first pull-up transistor 12 and the first pull-down transistor 16 constitute an inverter, which further form a series circuit 28. One end of the series circuit 28 is connected to a voltage source Vcc and the other end of the series circuit 28 is connected to a voltage source Vss. Similarly, the second pull-up transistor 14 and the second pull-down transistor 18 constitute another inverter and a series circuit 30. One end of the series circuit 30 is connected to the voltage source Vcc and the other end of the series circuit 30 is connected to the voltage source Vss. The two inverters are cross-coupled to each other to store data.

The storage node 24 is connected to the respective gates of the second pull-down transistor 18 and the second pull-up transistor 14. The storage node 24 is also connected to the drains of the first pull-down transistor 16, the first pull-up transistor 12 and the first access transistor 20. Similarly, the storage node 26 is connected to the respective gates of the first pull-down transistor 16 and first the pull-up transistor 12. The storage node 26 is also connected to the drains of the second pull-down transistor 18, the second pull-up transistor 14 and the second access transistor 21. The gates of the first access transistor 20 and the second access transistor 21 are respectively coupled to one word line 32; the sources of the first access transistor 20 and the second access transistor 21 are respectively coupled to a first bit line 34 and a second bit line 36.

SUMMARY OF THE INVENTION

The present invention provides a layout pattern of a memory device composed of static random access memory (SRAM), it includes four memory units located on a substrate, each memory unit being located in a non-rectangular region, the four non-rectangular regions combine a rectangular region, each memory unit includes a first inverter comprising a first pull-up transistor (PL1) and a first pull-down transistor (PD1), a second inverter comprises a second pull-up transistor (PL2) and a second pull-down transistor (PD2), an access transistor (PG) and a switching transistor (SW), wherein the source of the PG is coupled to an input terminal of the first inverter and a drain of the SW, a source of the SW is coupled to an output of the second inverter, wherein the PD1, the PD2, the SW, and the PG comprise a first diffusion region, the PL1 and the PL2 comprise a second diffusion region.

The present invention further provides a layout pattern of a memory device having a static random access memory (SRAM), it includes at least one memory unit located on a substrate and disposed within a region, the memory unit includes a first inverter comprising a first pull-up transistor (PL1) and a first pull-down transistor (PD1), a second inverter comprises a second pull-up transistor (PL2) and a second pull-down transistor (PD2), an access transistor (PG) and a switching transistor (SW), wherein a source of the PG is coupled to an input terminal of the first inverter and a drain of the SW, a source of the SW is coupled to an output of the second inverter, wherein the PD2, the SW, and the PG comprise a first diffusion region.

The present invention is characterized in that a 6T-SRAM cell and the corresponding layout pattern are provided. The 6T-SRAM cell includes only one access transistor and another switching transistor, the two transistors are connected to independent word line and mode line, and the latching state of the 6T-SRAM unit can be maintained or cut off by turning the transistor switched on or off. And the corresponding layout pattern includes six transistors arranged in a non-rectangular region, some transistors share a diffusion region, so that the limited space can be effective used, thereby reducing the overall area of the device. In addition, each of the four non-rectangular regions can be arranged in one rectangular area, which facilitates the arrangement of the 6T-SRAM cells.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
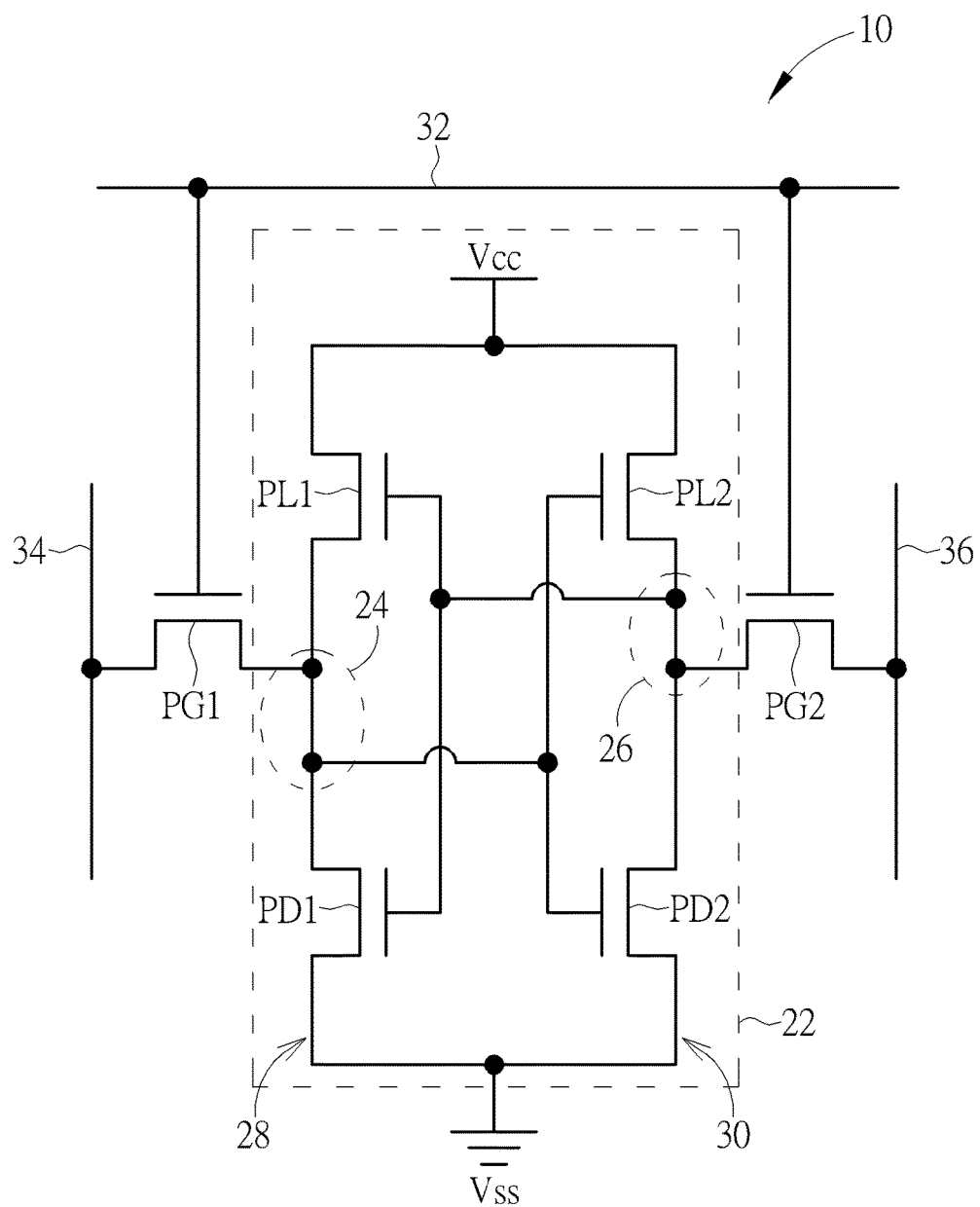
FIG. 1 shows a circuit diagram of a conventional six-transistor static random access memory (6T-SRAM).
Figure 2:
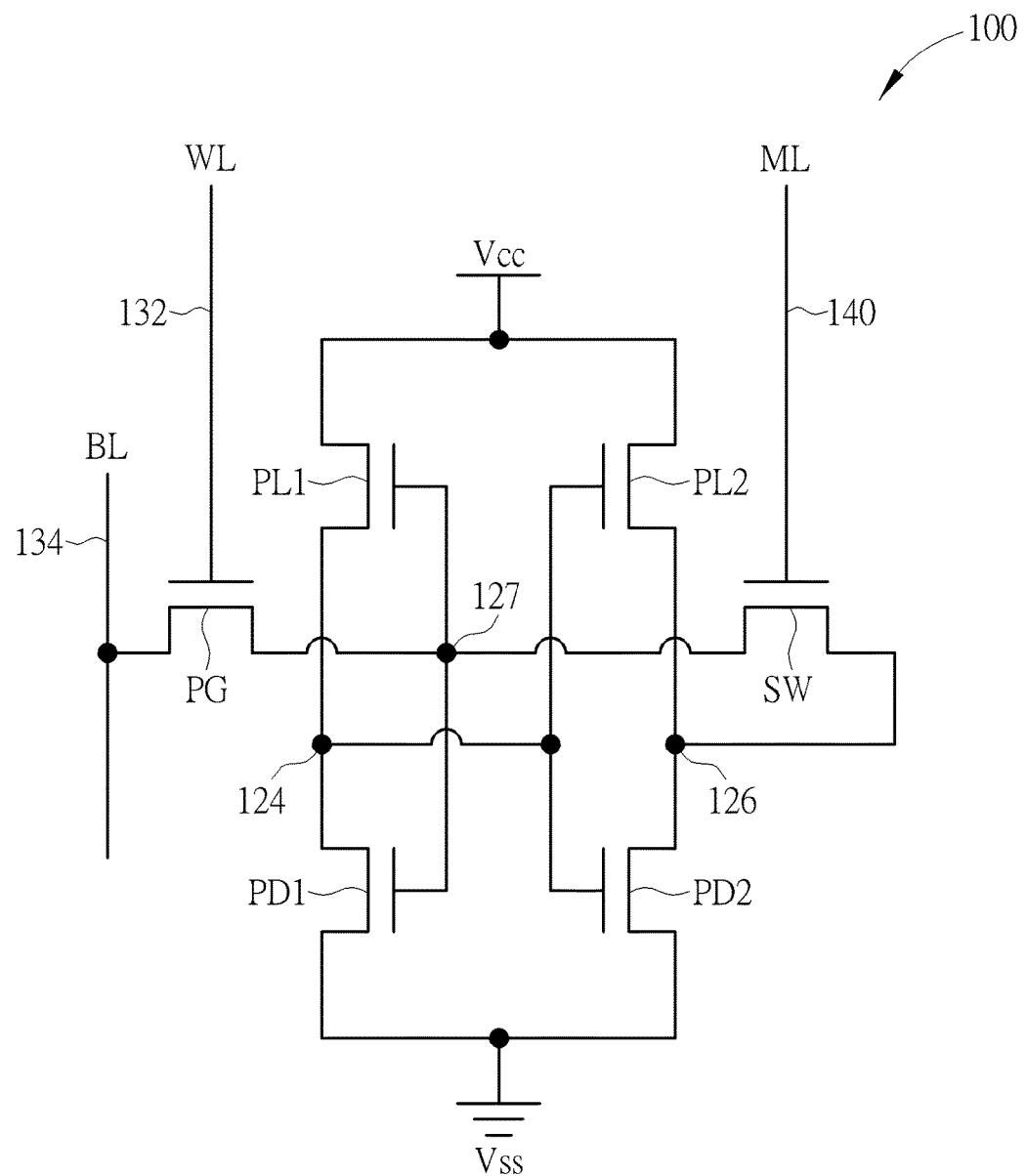
FIG. 2 is a circuit diagram showing a memory unit according to the first preferred embodiment of the present invention.

FIG. 2 generally illustrates a schematic of a memory cell (such as a six transistor cell) 100 according to the first preferred embodiment of the present invention. For example, one memory device may comprise a plurality of 6T-SRAM cells 100 arranged in matrix. Each 6T-SRAM cell 100 comprises a first inverter comprising a first storage node 124 lying between a first pull-up (such as a PMOS) transistor PL1 and a first pull-down (such as a NMOS) transistor PD1, and a second inverter comprising a second storage node 126 lying between a second pull-up (such as a PMOS) transistor PL2 and a second pull-down (such as a NMOS) transistor PD2. A gate of an access transistor PG (such as a NMOS) coupled to a word line (WL) 132. Therefore, the access transistor PG can be activated (turned "on") or deactivated (turned "off") through the word line 132. A source of the access transistor PG coupled to a bit line 134, and a drain of the access transistor PG coupled to gates of the first pull-up transistor PL1 and the first pull-down transistor PD1, as shown in node 127 of FIG. 2. Besides, the sources of the first pull-up transistor PL1 and the second pull-up transistor PL2 are connected to a voltage source Vcc, and the drains of the first pull-down transistor PD1 and the second pull-down transistor PD2 are connected to a voltage source Vss (or ground).

In the 6T-SRAM cell 100, the gates of the second pull-up transistor PL2 and the second pull-down transistor PD2 are coupled to one another, and electrically connected to the first storage node 124. The gates of the first pull-up transistor PL1 and the first pull-down transistor PD1 are coupled to one another, but not directly coupled to second storage node 126. Instead, a switching transistor SW is electrically connected to the gates the first pull-up transistor PL1 and the first pull-down transistor PD1, and also electrically connected to the second storage node 126. In other words, the node 127 is coupled to the second storage node 126 via the switching transistor SW. For the switching transistor SW such as an NMOS, the gate of the switching transistor SW is coupled to a mode line (ML) 140, and the mode line transfers independent signals from a controller (not shown) to control the switching transistor SW. Therefore, the switching transistor SW can be independently activated (turned "on") or deactivated (turned "off").

In the 6T-SRAM cell 100 of the present invention, by transferring different signals (logical "0" or "1") via the word line 132, the bit line 134 and the mode line 140, the access transistor PG and the switching transistor SW can be independently activated or deactivated, and to switch different modes of the 6T-SRAM cell 100. The operation mode and operation method of the 6T-SRAM cell have been disclosed in U.S. patent application Ser. No. 15/413,436, so it will not be described here. The following paragraphs will describe the layout of the 6T-SRAM cell 100.

Figure 3:
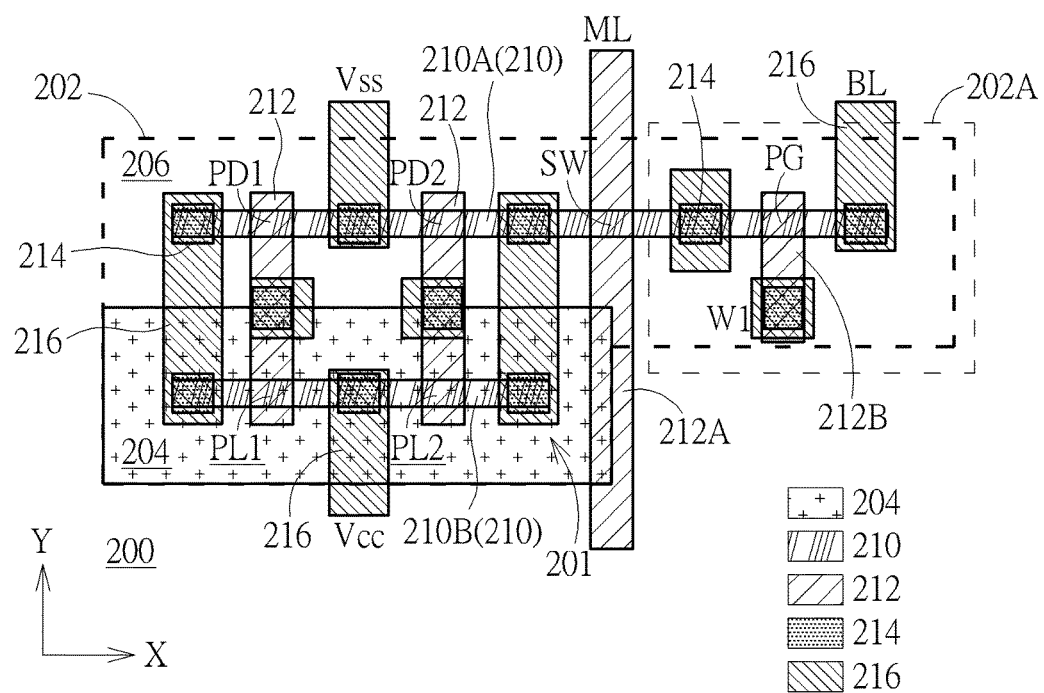
FIG. 3 illustrates a layout pattern of a single memory unit of the present invention.
Figure 4:
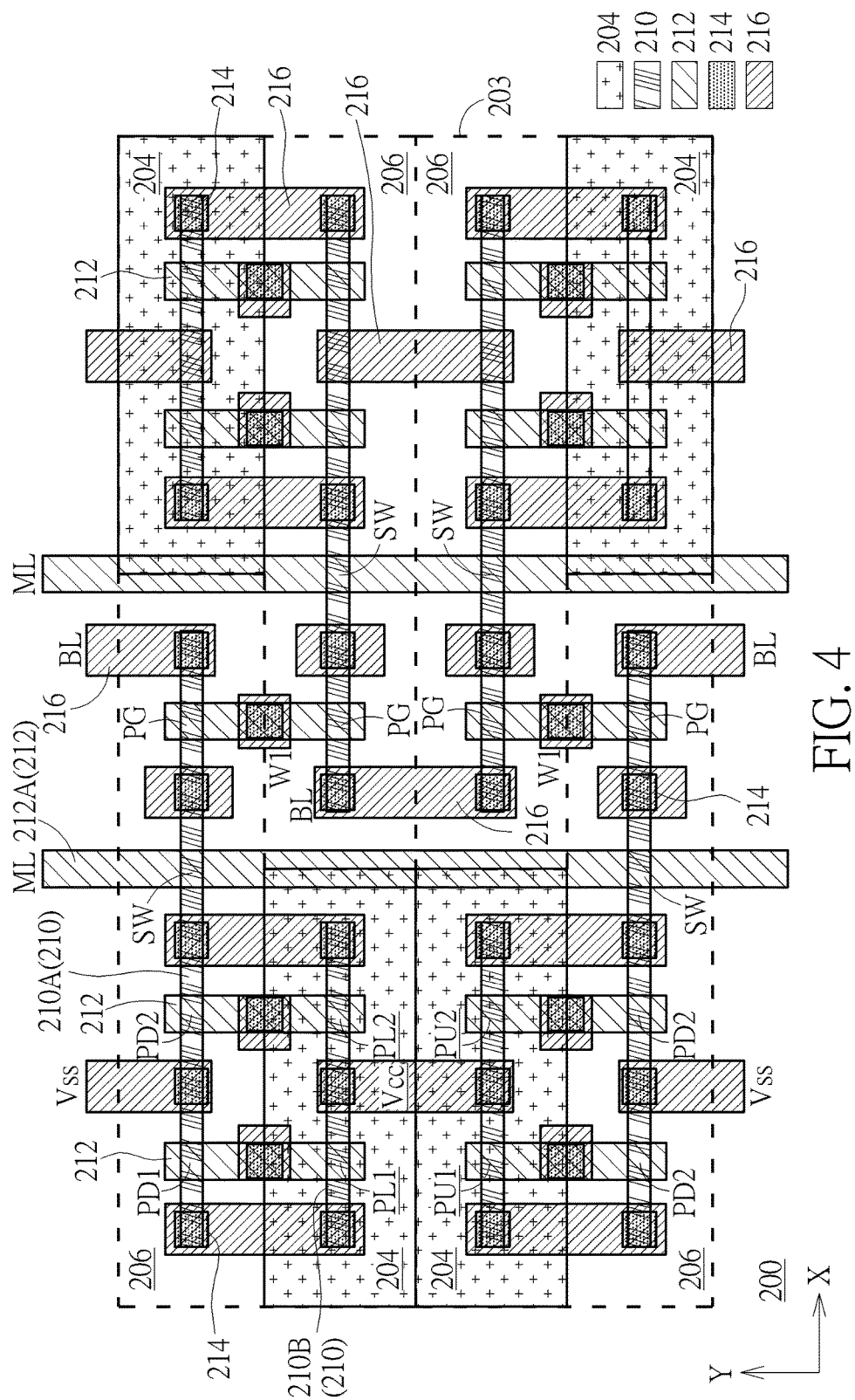
FIG. 4 shows a layout pattern in which four memory units are combined into a memory cell.
Figure 5:
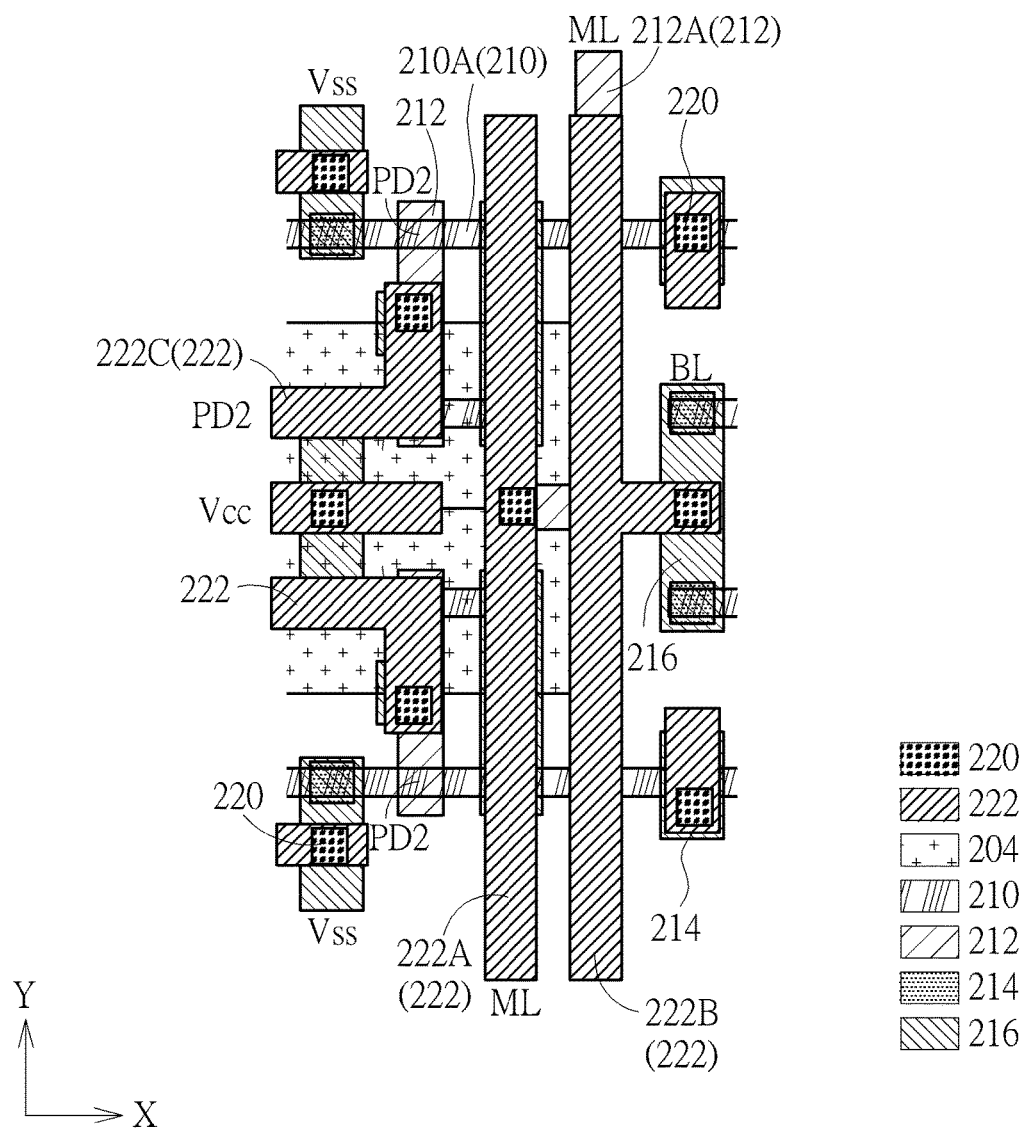
FIG. 5 shows the layout pattern of the metal layers of partial memory unit in the above layer.

FIG. 3 and FIG. 4 illustrate layout patterns of the memory device of the present invention. FIG. 3 shows a layout pattern of a single memory unit of the present invention, and FIG. 4 shows a layout pattern including four memory units combined to a memory cell. As shown in FIG. 3, a memory unit 201 of the present invention is located on a substrate 200 and is located within a non-rectangular region 202. For example, the non-rectangular region 202 is an L-shaped region and includes a first well region (e.g., N-type well region) 204 and a second well region (e.g., P-type well region). In addition, the plurality of transistors, including the first pull-up transistor PL1, the second pull-up transistor PL2, the first pull-down transistor PD1, the second pull-down transistor PD2, the access transistor PG, and the switching transistor SW are disposed in the non-rectangular region 202, each transistor includes a gate structure 212 crosses over a diffusion region 210. In the present invention, only the six transistors mentioned above are included in each non-rectangular region 202. In the present embodiment, the non-rectangular region 202 includes a first diffusion region 210A and a second diffusion region 210B, the first diffusion region 210A and the second diffusion region 210B have complementary conductivity type, for example, the first diffusion region 210A is an N-type diffusion region, and the second diffusion region 210B is a P-type diffusion region. The two diffusion regions are arranged in a first direction (e.g., an X-axis). The first pull-down transistor PD1, the second pull-down transistor PD2, the access transistor PG, and the switching transistor SW include the first diffusion region 210A, in other words, the four different gate structures of the four transistors cross over the first diffusion region 210A simultaneously, and forms the first pull-down transistor PD1, the second pull-down transistor PD2, the access transistor PG, and the switching transistor SW. On the other hand, the first pull-up transistor PL1 and the second pull-up transistor PL2 include the second diffusion region 210B, in other words, the two different gate structures of the two transistors cross over the second diffusion region 210B simultaneously, and forms the first pull-up transistor PL1 and the second pull-up transistor PL2.

In addition, the first diffusion region 210A and the second diffusion region 210B substantially extend along the same direction as the first well region 204 and the second well region 206 (for example, along the X axis). In the present embodiment, the non-rectangular region 202 is an L-shaped region, and it includes a protruding portion 202A, the access transistor PG is located in the protruding portion.

In the present invention, the switching transistor SW includes a mode line gate 212A, which crosses over the first diffusion region 210A, the access transistor PG includes an access gate 212B, which crosses the first diffusion region 210A. It is noteworthy that in the present invention, the threshold voltage (Vt) of the switching transistor SW is preferably smaller than the threshold voltage of the access transistor PG, the threshold voltage of the first pull-down transistor PD1, and the threshold voltage of the second pull-down transistor PD2, so that the switching transistor SW is easily turned on or turned off. In order to achieve the object, in some embodiments, the gate length of the mode line gate 212A may be made smaller than the gate length of the access gate 212B through the optical correction (OPC) or by other suitable methods, such as ion implantation or adjusting the work function metal layer of each transistor. To achieve that the threshold voltage of the switching transistor SW is smaller than the threshold voltage of the access transistor PG, the threshold voltage of the first pull-down transistor PD1, and the threshold voltage of the second pull-down transistor PD2.

In the present embodiment, a plurality of contact structures 214 and a plurality of metal layers 216 are formed in the non-rectangular region 202, and the contact structures 214 and the metal layers are connected to the transistors. The metal layers 216 are preferably arranged in a second direction (e.g., Y-axis), but are not limited thereto. The contact structures 214 and the plurality of metal layers 216 are used to connect the different transistors to each other (e.g., the drain of the first pull-up transistor PL1 is connected to the source of the first pull-down transistor PD1 through the contact structure and the metal layer), or connected the transistors to other voltage sources or wires (such as voltage source Vss or word line WL, etc.). In order to clearly describe the connection relationships between the components, FIG. 3 directly shows the corresponding voltage source or wire of the metal layer 216 on the figure.

According to the layout pattern shown in FIG. 3 above, each transistor can be closely arranged in a space-limited non-rectangular region 202, thereby reducing the overall device area. In addition, due to the diffusion regions, the gate structures and the metal layers are all linear structure, so they also have advantages of simple process.

FIG. 4 is a schematic diagram showing a layout pattern in which four identical memory units 201 are arranged in a rectangular region. As shown in FIG. 4, the four memory units 201 may be arranged into a rectangular region 203, which has a more regular boundary shape than the non-rectangular region 202, and facilitates neatly arranging the plurality of memory units 201 on the substrate 200, thereby reducing the area wasting. In addition, when the four memory units 201 are arranged together, some elements may be shared with each other, such as the above-described mode line gate 212A, the access gate 212B, and some metal layer 216 (e.g., the metal layers that connecting the voltage source Vcc, the voltage source Vss, the mode line ML, the word line WL, and the bit line BL) are overlapped with at least two different non-rectangular regions 202. In other words, different memory units 201 located within different non-rectangular regions 202 share parts of gate structure or share parts of metal layer.

In FIG. 4, in order to simplify the drawing, some elements are not labeled, but the elements having the same function are drawn by the same fill pattern. For example, the mode line gate 212A, the access gate 212B, and the gate crossing over the first pull-up transistor PL1 or the second pull-up transistor PL2 belong to the gate structure 212, and they have the same fill pattern. The other elements also follow this rule, so FIG. 4 should clearly describe the function of each element.

In the following steps, other layers with different layout patterns may be formed above the layout pattern shown in FIG. 4. For example, forming a multilayer contact plugs or metal layers above the layout pattern shown in FIG. 4, and the transistors are therefore connected to other elements (for example, the word line WL, the bit line BL, etc.). The present invention does not limit the shapes and the arrangement of other layer layout patterns, but it should be understood that forming the other layers may also be within the scope of the present invention.

It is noteworthy that in one embodiment of the present invention, a plurality of second metal layers 222 and a plurality of second metal plugs 220 are formed in the upper layer of the layout pattern shown in FIG. 4. The second metal layer 222 includes a second metal layer 222A connected to the lower mode line gate 212A, a second metal layer 222B connected to the lower bit line BL, and a second metal layer 222C connected to the lower second pull-down transistor PD2. Besides, the present invention preferably further comprises a metal wire connected to the mode line gate 212A, to reduce the resistance of the overall mode line gate 212A, and to improve the operation performance of the memory device. In addition, the second metal layer 222A is located between the second metal layer 222B and the second metal layer 222C, this arrangement is effective utilizing the space without increasing the additional area of the layout pattern. However, the present invention is not limited to the above-described arrangement.

In summary, the present invention is characterized in that a 6T-SRAM cell and the corresponding layout pattern are provided. The 6T-SRAM cell includes only one access transistor and another switching transistor, the two transistors are connected to independent word line and mode line, and the latching state of the 6T-SRAM unit can be maintained or cut off by turning the transistor switched on or off. And the corresponding layout pattern includes six transistors arranged in a non-rectangular region, some transistors share a diffusion region, so that the limited space can be effective used, thereby reducing the overall area of the device. In addition, each of the four non-rectangular regions can be arranged in one rectangular area, which facilitates the arrangement of the 6T-SRAM cells.

The following description will detail the different embodiments of the layout pattern of the memory device of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 6:
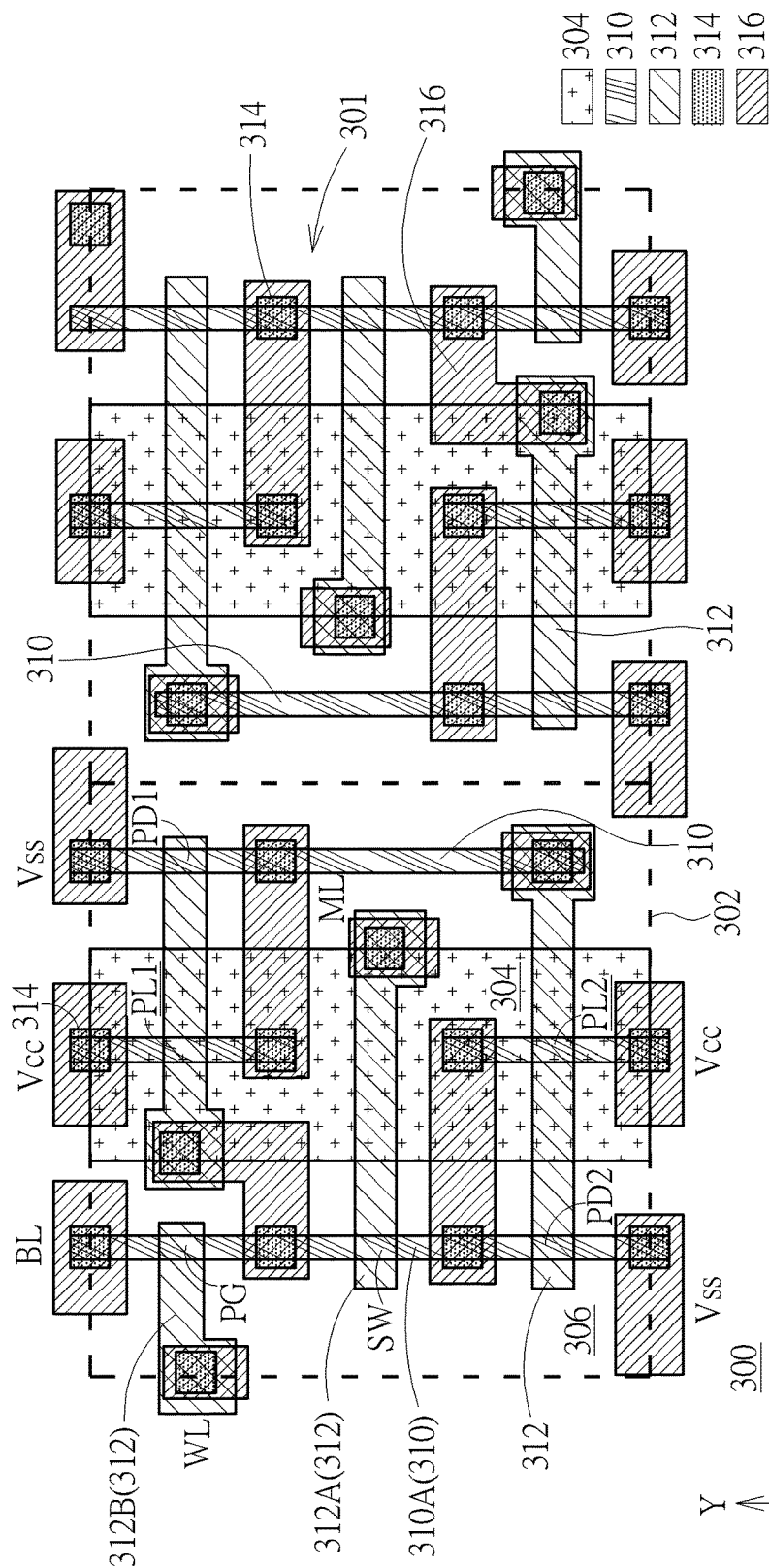
FIG. 6 illustrates a layout pattern of a memory unit according to another embodiment of the present invention.

Another embodiment of the present invention is also a layout pattern according to the 6T-SRAM cell 10 shown in FIG. 2. Referring to FIG. 6, the memory unit 301 is located on the substrate 300 and is located within a region 302. The memory unit 301 also comprises a plurality of transistors including the first pull-up transistor PL1, the second pull-up transistor PL2, the first pull-down transistor PD1, the second pull-down transistor PD2, the access transistor PG and the switching transistor SW, wherein each of the transistors includes a gate structure 312 crosses over a diffusion region 310. The region 302 includes a first well region (e.g., an N-type well region) 304 and two second well regions (e.g., P-type well regions). Preferably, the first well region 304 and the second well regions 306 are arranged in a second direction (e.g., a Y axis).

In the present embodiment, only the six transistors mentioned above are included in each region 302. The region 302 further comprises a plurality of diffusion regions 310 and a plurality of gate structures 312, each diffusion region 310 is arranged in a second direction (e.g., Y-axis). The second pull-down transistor PD2, the access transistor PG, and the switching transistor SW include the same diffusion region (defined as the first diffusion region 310A). In other words, three different gate structures simultaneously cross over the first diffusion region 310A, and to form the second pull-down transistor PD2, the access transistor PG, and the switching transistor SW.

In the present invention, the switching transistor SW includes a mode line gate 312A, which crosses over the first diffusion region 310A, the access transistor PG includes an access gate 312B, which crosses over the first diffusion region 310A. It is noteworthy that in the present invention, the threshold voltage (Vt) of the switching transistor SW is preferably smaller than the threshold voltage of the access transistor PG, the threshold voltage of the first pull-down transistor PD1, and the threshold voltage of the second pull-down transistor PD2, so that the switching transistor SW is easily turned on or turned off. In order to achieve the object, in some embodiments, the gate length of the mode line gate 312A may be made smaller than the gate length of the access gate 312B through the optical correction (OPC) or by other suitable methods, such as ion implantation or adjusting the work function metal layer of each transistor. To achieve that the threshold voltage of the switching transistor SW is smaller than the threshold voltage of the access transistor PG, the threshold voltage of the first pull-down transistor PD1, and the threshold voltage of the second pull-down transistor PD2.

In the present embodiment, a plurality of contact structures 314 and a plurality of metal layers 316 are formed in the region 302, and are connected to the transistors. The metal layers 316 are preferably arranged in a first direction (e.g., X-axis), but are not limited thereto. The contact structures 314 and the plurality of metal layers 316 are used to connect the different transistors to each other (e.g., the drain of the first pull-up transistor PL1 is connected to the source of the first pull-down transistor PD1 through the contact structure and the metal layer), or connected the transistors to other voltage sources or wires (such as voltage source Vss or word line WL, etc.). In order to clearly describe the connection relationships between the components, FIG. 6 directly shows the corresponding voltage sources or wires of the metal layer 316 on figure.

The present embodiment is same as the first embodiment described above, it provides a layout pattern according to the 6T-SRAM cell 10 shown in FIG. 2. The memory units of the first embodiment are arranged more closely in the non-rectangular region, so that the area occupied by each memory unit is small in the first embodiment. In the present embodiment, the memory unit is arranged in a rectangular area, which facilitates the arrangement of the memory units.

In the above embodiments, the planar transistors are taken as the examples, in other words, the gate structures cross over the diffusion regions. However, the present invention may also include fin-FET, more precisely, a plurality of fin structures can replace the diffusion regions on the substrate, and the gate structures cross the fin structures to form a plurality of fin-FET, it should also be within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout pattern of a memory device having a static random access memory (SRAM), comprising:
   four memory units located on a substrate, each memory unit is located in a non-rectangular region, the four non-rectangular regions combine a rectangular region, wherein each memory unit comprising:
   a first inverter comprising a first pull-up transistor (PL1) and a first pull-down transistor (PD1);
   a second inverter comprises a second pull-up transistor (PL2) and a second pull-down transistor (PD2);
   an access transistor (PG) and a switching transistor (SW), wherein a source of the PG is coupled to an input terminal of the first inverter and a drain of the SW, a source of the SW is coupled to an output of the second inverter, wherein the PD1, the PD2, the SW, and the PG comprise a first diffusion region, the PL1 and the PL2 comprise a second diffusion region.

2. The layout pattern of a memory device having a static random access memory of claim 1, wherein each non-rectangular region comprises only six transistors disposed therein.

3. The layout pattern of a memory device having a static random access memory of claim 1, further comprising a mode line gate disposed on the substrate, wherein the SW of each memory unit comprises the mode line gate crosses over the first diffusion region.

4. The layout pattern of a memory device having a static random access memory of claim 3, wherein the mode line gate overlaps at least two non-rectangular regions of the four non-rectangular regions.

5. The layout pattern of a memory device having a static random access memory of claim 3, wherein the PG comprises an access gate crosses over the first diffusion region.

6. The layout pattern of a memory device having a static random access memory of claim 5, wherein a gate length of the mode line gate is less than a gate length of the access gate.

7. The layout pattern of a memory device having a static random access memory of claim 3, further comprising a second mode line gate metal layer electrically connected to the mode line gate, wherein the second mode line gate metal layer is disposed in a layer disposed above the mode line gate, and the second mode line gate metal layer is disposed between the second pull down transistor (PD2) and a bit line metal layer.

8. The layout pattern of a memory device having a static random access memory of claim 1, wherein each non-rectangular region is an L-shaped region, and the L-shaped region includes a protruding portion.

9. The layout pattern of a memory device having a static random access memory of claim 8, wherein each PG of each memory unit is located within the protruding portion.

10. The layout pattern of a memory device having a static random access memory of claim 1, wherein the first diffusion region and the second diffusion region are arranged in parallel to each other.

11. The layout pattern of a memory device having a static random access memory of claim 1, wherein the first diffusion region has a first conductivity type, the second diffusion region has a second conductivity type which is complementary to the first conductivity type.

12. The layout pattern of a memory device having a static random access memory of claim 1, further comprising at least one word line metal layer and at least one bit line metal layer disposed on the substrate, wherein the word line metal layer overlaps at least two non-rectangular regions of the four non-rectangular regions, the bit line metal layer overlaps at least two non-rectangular regions of the four non-rectangular regions.

13. The layout pattern of a memory device having a static random access memory of claim 1, further comprising a plurality of voltage source metal layers disposed on the substrate, wherein an extending direction of the voltage source metal layer is perpendicular to an extending direction of the first diffusion region.

14. A layout pattern of a memory device having a static random access memory (SRAM), comprising:
   at least one memory unit located on a substrate and disposed within a region, wherein the memory unit comprising:
      a first inverter comprising a first pull-up transistor (PL1) and a first pull-down transistor (PD1);
      a second inverter comprises a second pull-up transistor (PL2) and a second pull-down transistor (PD2);
      an access transistor (PG) and a switching transistor (SW), wherein a source of the PG is coupled to an input terminal of the first inverter and a drain of the SW, a source of the SW is coupled to an output of the second inverter, wherein the PD2, the SW, and the PG comprise a first diffusion region.

15. The layout pattern of a memory device having a static random access memory of claim 14, wherein the region comprises only six transistors disposed therein.

16. The layout pattern of a memory device having a static random access memory of claim 14, further comprising a mode line gate disposed on the substrate, wherein the SW of each memory unit comprises the mode line gate crosses over the first diffusion region.

17. The layout pattern of a memory device having a static random access memory of claim 16, wherein the PG comprises an access gate crosses over the first diffusion region, a gate length of the mode line gate is less than a gate length of the access gate.

18. The layout pattern of a memory device having a static random access memory of claim 14, further comprising at least one word line metal layer and at least one bit line metal layer disposed on the substrate.

19. The layout pattern of a memory device having a static random access memory of claim 14, further comprising a plurality of voltage source metal layers disposed on the substrate.

20. The layout pattern of a memory device having a static random access memory of claim 19, wherein an extending direction of the voltage source metal layer is perpendicular to an extending direction of the first diffusion region.

* * * * *